(12) United States Patent
Sioma

(10) Patent No.: US 8,237,500 B1
(45) Date of Patent: Aug. 7, 2012

(54) SIGNAL CORRECTION CIRCUIT FOR REDUCING ERRORS AND DISTORTIONS AND ITS ASSOCIATED METHOD OF OPERATION

(76) Inventor: Edward M. Sioma, Levittown, PA (US)

( * ) Notice: Subject to any disclaimer, the term of this patent is extended or adjusted under 35 U.S.C. 154(b) by 0 days.

(21) Appl. No.: 13/053,508

(22) Filed: Mar. 22, 2011

(51) Int. Cl.
*H03F 1/26* (2006.01)
(52) U.S. Cl. ........................................ 330/149
(58) Field of Classification Search .......... 330/149
See application file for complete search history.

(56) References Cited

U.S. PATENT DOCUMENTS

| | | | |
|---|---|---|---|
| 5,867,065 A * | 2/1999 | Leyendecker | 330/149 |
| 6,141,390 A * | 10/2000 | Cova | 330/149 |
| 6,320,463 B1 * | 11/2001 | Leva et al. | 330/149 |
| 6,606,484 B1 | 8/2003 | Faulkner | |
| 7,680,468 B2 | 3/2010 | Rabjohn et al. | |
| 2011/0156815 A1 * | 6/2011 | Kim et al. | 330/149 |

FOREIGN PATENT DOCUMENTS

JP 358175309 A * 10/1983

* cited by examiner

*Primary Examiner* — Khanh V Nguyen
(74) *Attorney, Agent, or Firm* — LaMorte & Associates, P.C.

(57) ABSTRACT

A correction circuit and method that is used in a system that produces an initial signal and has downstream components that adds a distortion error to that initial signal. The distortion error is added to the initial signal by the downstream components in the system. This creates a distorted output signal. The distorted output signal is then subtracted from the initial signal to obtain an initial negative distortion error. The initial negative distortion error is subtracted from the initial signal to create an initial conditioned signal. The initial conditioned signal is supplied to the electronic component of the system in place of the initial signal. The result is a reduction in distortion and noise that loops and adapts to changing signal patterns.

11 Claims, 3 Drawing Sheets

SIGNAL CORRECTION CIRCUIT FOR REDUCING ERRORS AND DISTORTIONS AND ITS ASSOCIATED METHOD OF OPERATION

BACKGROUND OF THE INVENTION

1. Field of the Invention

In general, the present invention relates to circuits that reduce distortion and noise from signals that are amplified or are otherwise subject to distortion. More particularly, the present invention relates to circuits that correct a signal for distortion prior to the occurrence of the distortion.

2. Prior Art Description

Many modern electronic devices have circuitry that utilizes semiconductor devices, such as diodes and transistors. Such semiconductor devices are nonlinear in nature. That is, such devices have exponential characteristics that tend to produce signal distortions.

Circuit designers are aware of the distortions created by such semiconductor devices. Consequently, circuit designers actively attempt to create circuits that minimize the inherent distortions. However, this typically requires circuit designers to create circuits with semiconductor devices that are forward biased, i.e. consuming power. The results are circuit designs that are highly complex and/or consume excess amounts of power, just to obtain an acceptable level of distortion.

For example in U.S. Pat. No. 7,680,468 entitled, Method and Apparatus For Distortion Correction Of RF Amplifiers, a circuit is presented for reducing the distortion in an amplified signal. However, the circuit is complex, using a digital signal processor, a local oscillator and band pass filters. Furthermore, the circuit is only suitable for a small band of signal frequencies. The prior art circuit is also limited in that it cannot work with direct current signals.

Even simpler correction circuits, such as that disclosed in U.S. Pat. No. 6,606,484 to Faulkner, entitled Distortion Correction Circuit For Direct Conversion Receiver, also require a local oscillator and band pass filtering. Accordingly, such prior art correction circuits cannot operate with DC input signals.

A need therefore exists for a circuit and method that can reduce distortion and noise in a wide range of signals, that include both AC and DC signals. A need also exists for a circuit and method that can reduce distortion yet embodies simple analog computing circuitry, therein allowing the correction circuit to be simply integrated into other circuit designs. Lastly, a need exists for a distortion correction circuit that consumes very little power and does not contain any semiconductor devices that must be forward biased in order for the circuit to operate properly. These needs are met by the present invention as described and claimed below.

SUMMARY OF THE INVENTION

The present invention is a correction circuit and method that is used in a system that produces an initial signal and has at least one electronic component that adds a distortion error to that initial signal. The correction circuit conditions the initial signal to compensate for the distortion error.

The distortion error is added to the initial signal by the electronic components in the system. This creates a distorted output signal. The distorted output signal is then subtracted from the initial signal to obtain an initial negative distortion error. The initial negative distortion error is subtracted from the initial signal to create an initial conditioned signal. The initial conditioned signal is supplied to the electronic component of the system in place of the initial signal. The result is a reduction in distortion and noise that loops and adapts to changing signal patterns.

BRIEF DESCRIPTION OF THE DRAWINGS

For a better understanding of the present invention, reference is made to the following description of exemplary embodiments thereof, considered in conjunction with the accompanying drawings, in which.

DETAILED DESCRIPTION OF THE DRAWINGS

Figure 1:
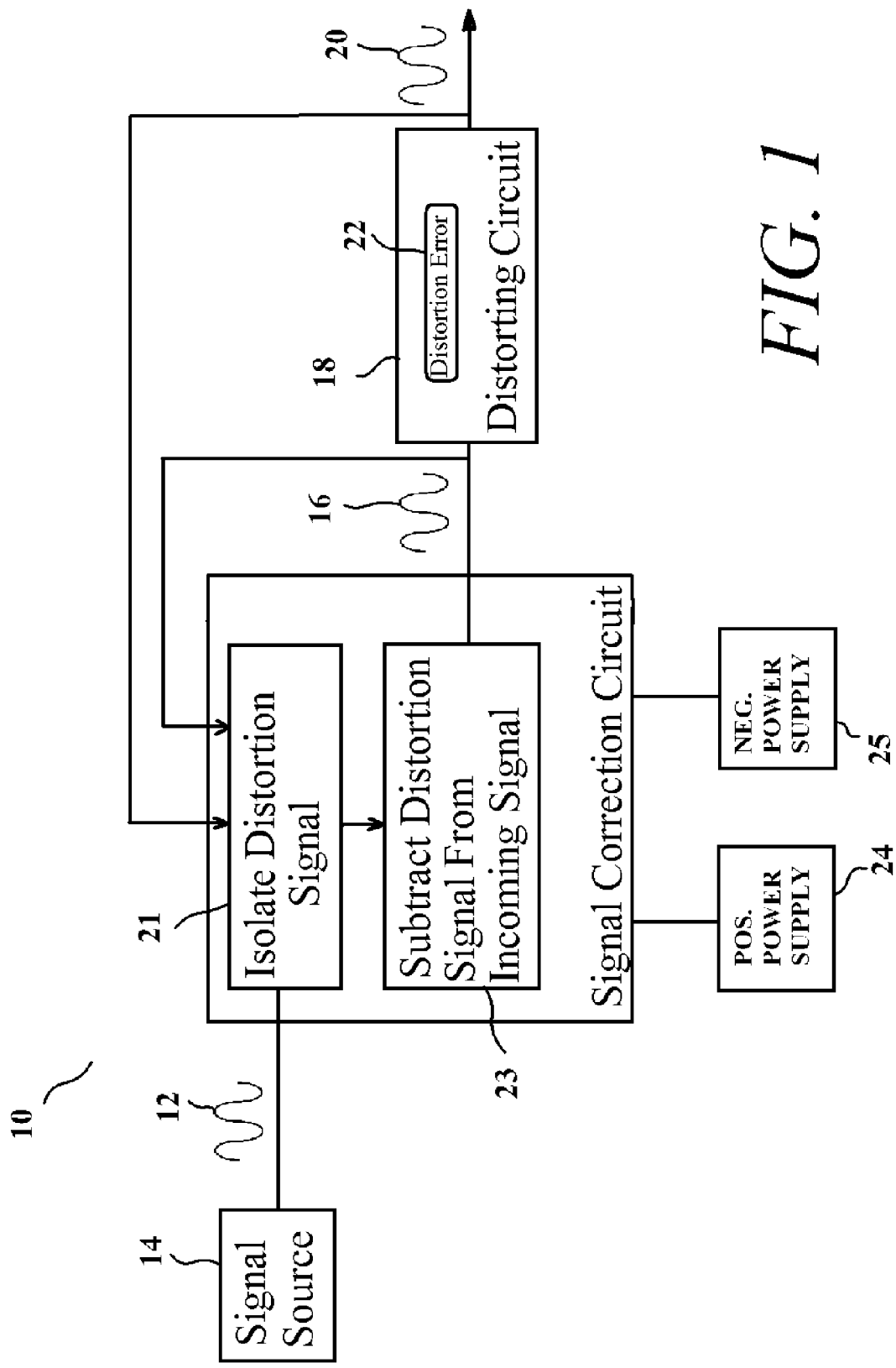
FIG. 1 is a block diagram showing the base methodology of the present invention signal correction circuit.
Figure 2:
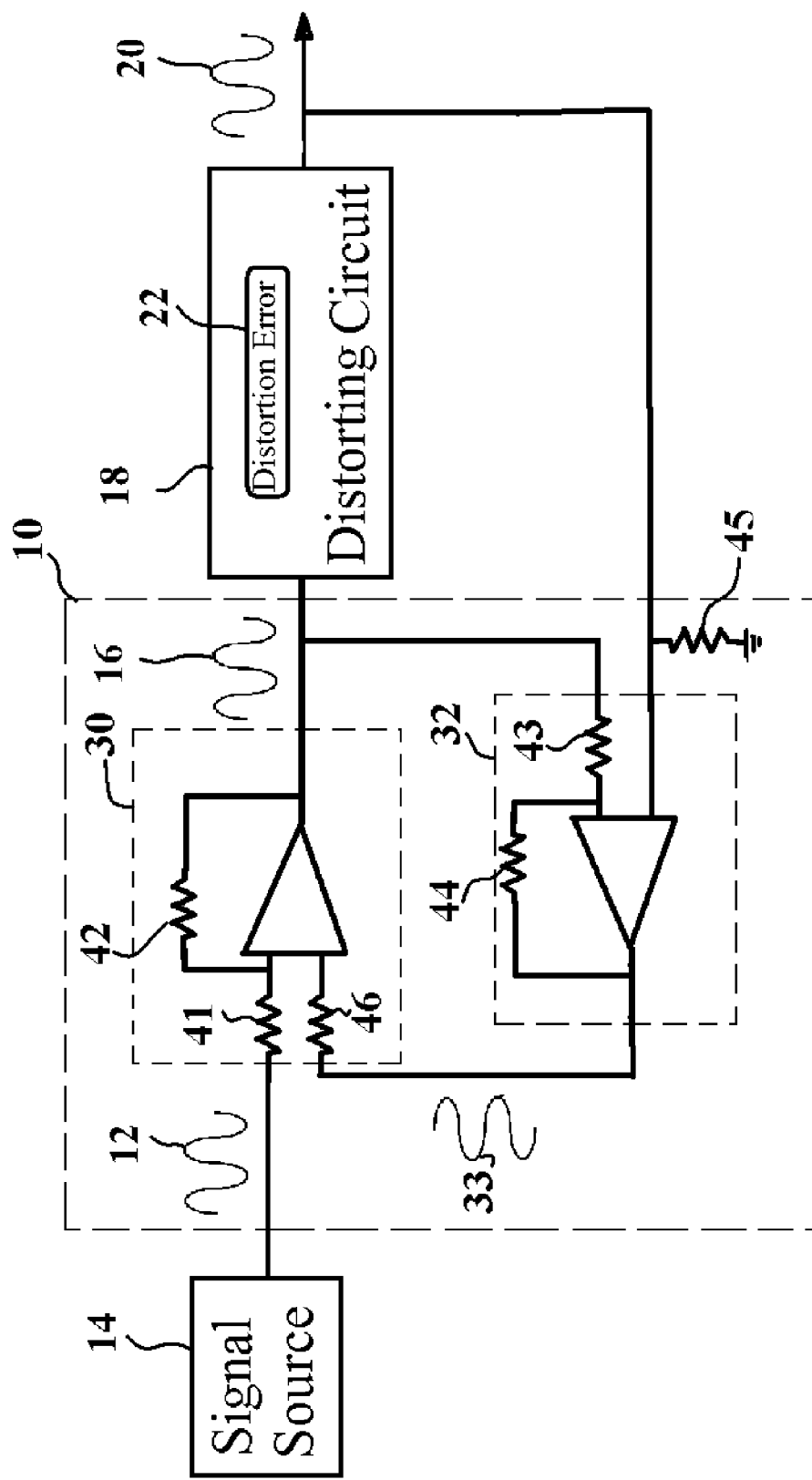
FIG. 2 is a schematic showing the components of a first exemplary embodiment of the signal correction circuit being used to correct an AC signal.
Figure 3:
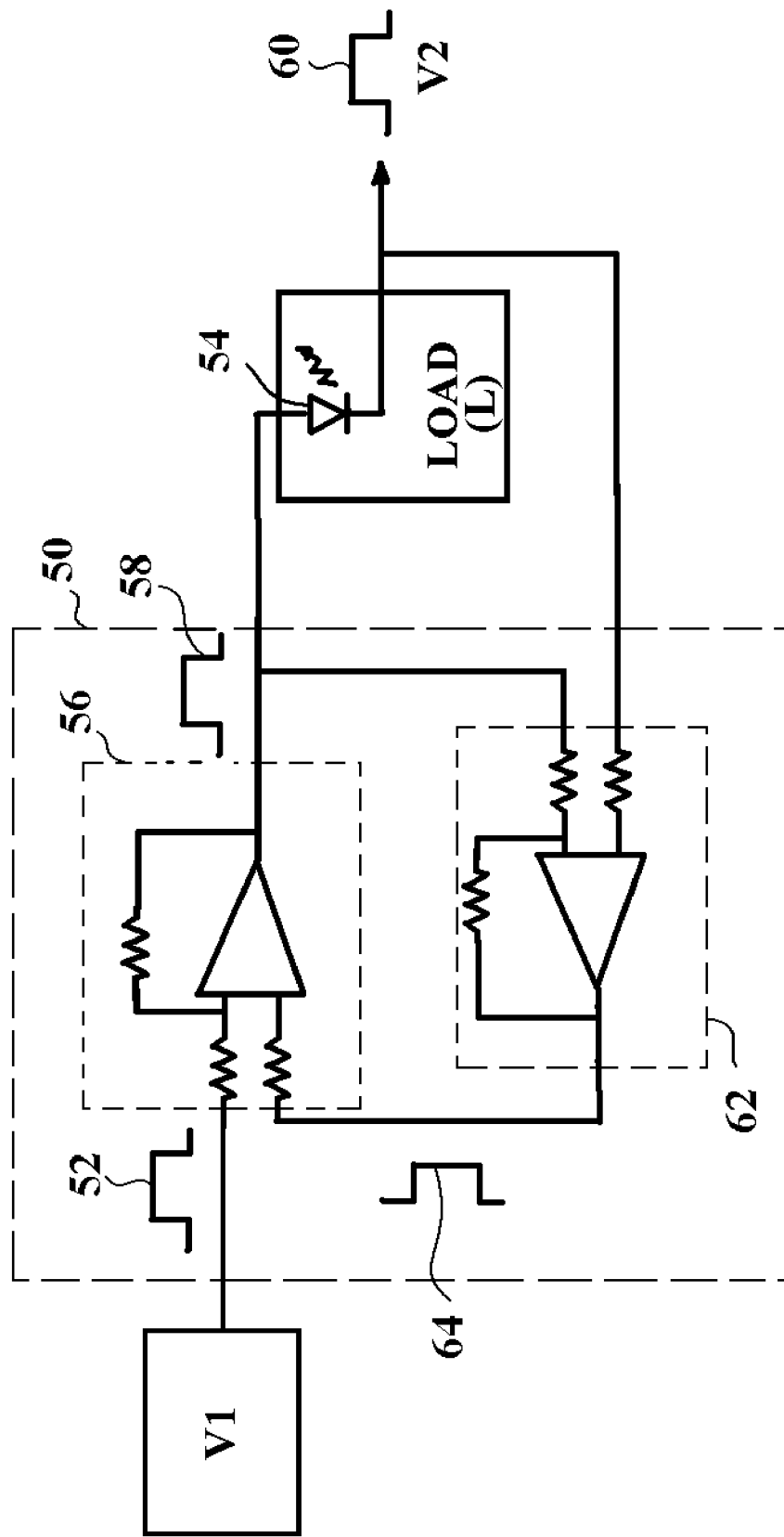
FIG. 3 is a schematic showing the components of a second exemplary embodiment of the signal correction circuit being used to correct a DC power signal.

Although the present invention signal correction circuit can be used in a wide variety of both AC and DC signals, only two exemplary embodiments of the invention are illustrated in FIGS. 2 and 3 respectively. The embodiment of FIG. 1 is generic to both embodiments. In one embodiment, an AC signal is corrected for distortions created by downstream semiconductor components. In the second embodiment, a DC power signal is corrected to compensate for the biasing requirements of a light emitting diode (LED).

The two selected embodiments are selected in order to set forth the best modes contemplated for the invention. The illustrated embodiments, however, are merely exemplary and should not be considered limitations when interpreting the scope of the appended claims.

Referring to FIG. 1, an abstract block diagram of the overall signal correction circuit 10 is illustrated to help explain its overall function. The signal correction circuit 10 receives an incoming signal 12 from a signal source 14. The incoming signal 12 can be either an AC signal or a DC signal. The circuit's operational range for the incoming signal 12 is preferably between 0 kHz and 20 Khz. If the incoming signal 12 is an AC signal, the signal source 14 can be a microphone, a preamplifier or any other signal effecting circuit or device. Alternatively, if the incoming signal 12 is a DC signal, the signal source 14 can be a DC power supply, a battery, or any DC current control circuit.

The incoming signal 12 is considered to be the baseline initial signal. The purpose of the signal correction circuit 10 is to maintain the fidelity of the incoming signal 12 as it passes through distorting circuitry downstream in the system. If the incoming signal 12 is an AC signal, the distorting circuitry can be a power amplifier that contains non-linear semiconductor elements. If the incoming signal is a DC power signal, the distorting circuitry can be any solid-state load device, such as an LED.

The incoming signal 12 is processed by the signal correction circuit 10 and becomes a conditioned signal 16. Initially, the conditioned signal 16 is the same as the incoming signal 12. The initial conditioned signal 16 passes to the distorting circuitry 18. The distorting circuitry 18 adds noise and other distortions to the incoming signal 12. Accordingly, the distorted output signal 20 from the distorting circuitry 18 is equal to the incoming signal 12 plus a distortion error 22.

The distorted output signal 20 is fed back to the signal correction circuit 10. Within the signal correction circuit 10, the distortion error 22 created by the distorting circuitry 18 is isolated. See Block 21. The distortion error 22 is calculated as a negative. The distortion error 22 is then subtracted from the incoming signal 12 to produce a subsequent conditioned signal. See Block 23. This loop is endlessly repeated so that the distortion error 22 is constantly recalculated and subsequent conditioned signals are constantly replacing incoming signals.

As will be explained, the distortion error 22 is slightly delayed by the circuitry in the signal correction circuit 10. As a result, a slightly delayed negative distortion error 22 is subtracted from the input signal 12, therein creating beneficial characteristics in the conditioned signal 16.

In FIG. 1, it will also be seen that two power supplies 24, 25 are used to power the signal correction circuit 10. One power supply 24 is a positive power supply, the other power supply 25 is negative. The use of a positive power supply 24 and a negative power supply 25 enables the signal correction circuit to correct either negative signals or positive signals, therein making the signal correction circuit 10 very robust to a variety of applications. However, it will be understood that if the signal correction circuit 10 were designed into a larger dedicated circuit that only were to use positive or negative signals, only a single power supply would need to be used.

Referring now to FIG. 2 in conjunction with FIG. 1, the operational details of the signal correction circuit 10 are better detailed. In this embodiment, two subtractor circuits 30, 32 are provided. Subtractor circuit 30 receives the incoming signal 12 from the signal source 14. The output of the subtractor circuit 30 is the conditioned signal 16 that is fed to the distorting circuitry 18. The distorting circuitry 18 adds the distortion error 22 into the conditioned signal 16. It will therefore be understood that the distorted output signal 20 leaving the distorting circuitry 18 is equal to the conditioned signal 16 plus the distortion error 22. In the first loop, the conditioned signal 16 is the same as the input signal 12. As such, in the first loop, the distorted output signal 20 is equal to the input signal 12 plus the distortion error 22.

Subtractor circuit 32 receives both the conditioned signal 16 and the distorted output signal 20. The distorted output signal 20 is subtracted from the conditioned signal 16. The result is the distortion error 22 in the negative, i.e. −1 (distortion signal), herein referred to as the negative distortion error signal 33. The negative distortion error signal 33 is fed to the subtractor circuit 30, wherein the negative distortion error signal 33 is added to the incoming signal 12. The result is the conditioned signal 16 leaving the subtractor circuit 30, wherein the conditioned signal 16 is equal to the initial incoming signal 12 minus the negative distortion error signal. This conditioned signal is then fed to the distorting circuitry 18. As has been previously been described, the distorting circuitry 18 adds the distortion error 22 to the conditioned signal. The conditioned signal 16 already contains a negative of the distortion error 22. As a consequence, the distortion error 22 added by the distorting circuitry 18 is cancelled and the output of the distorting circuitry 18 is automatically corrected to resemble the initial incoming signal 12. This loop is repeated endlessly for as long as the incoming signal 12 exists.

It will be understood that the negative distortion error signal 33 being fed to the subtractor circuit 30 is slightly delayed in relation to the incoming signal 12. The delay is under 1 microsecond.

However, the delay in the negative distortion error signal 33 is unperceivable by human senses in the operational frequencies of 0 KHz to 20 Khz. Furthermore, the slight delay prevents phase harmonic distortions that can make a looping circuit unstable.

Although many subtraction circuit configuration types can be used, the embodiment of FIG. 2 shows subtraction circuits 30, 32 made from integrated operational amplifiers, such as Texas Instrument types TL082, with resistors 41, 42, 43, 44, 45, 46. The resistors 41, 42, 43, 44, 45, 46 for the illustrated exemplary circuit are precision resistors with values of 100 k Ohms+/−1%. Accordingly, it will be understood that the signal correction circuit 10 can be made as an analog computing circuit. All elements are directly coupled without capacitors or transformers.

Referring to FIG. 3, an alternate embodiment of the present invention signal correction circuit 50 is used. In this embodiment, the signal correction circuit 50 is being used to correct the voltage of an incoming DC power signal.

The incoming power signal 52 has a predetermined voltage V1. Initially the voltage V1 passes through the signal correction circuit and is used at a load L. The load L can be any DC powered electro-mechanical device. In the shown embodiment, an LED 54 is used by way of example. LEDs require constant power supplies that provide a voltage over the operational voltage of the LED. As the incoming power signal 52 passes through the load L, the voltage is lowered.

Consequently, the voltage V2 after the load L is lower than the voltage V1 before the load L. The reduced voltage (V1-V2) can be considered a power signal error.

A first subtractor circuit 56 receives the incoming power signal 52 from the power source. The output of the first subtractor circuit 56 is a conditioned power signal 58 that is fed to the load L. The load L reduces the voltage of the conditioned power signal 58. It will therefore be understood that the reduced output power signal 60 leaving the load L is equal to the conditioned power signal 58 minus some loss in voltage. In the first loop, the conditioned power signal 58 is the same as the incoming power signal 52. As such, in the first loop, the reduced output power signal is equal to the input power signal minus some loss in voltage.

A second subtractor circuit 62 receives both the conditioned power signal 58 and the reduced output power signal 60. The conditioned power signal 58 is subtracted from the reduced output power signal 60. The result is a negative error signal 64. The negative error signal 64 is fed to the first subtractor circuit 56, wherein the negative error signal 64 is subtracted from the incoming power signal 52. The result is a conditioned power signal 58 leaving the first subtractor circuit 56 that is equal to the initial incoming power signal 52 minus the negative error signal 64. This conditioned power signal 58 is then fed to the load L. The conditioned power signal 58 already contains the negative error signal 64. As a consequence, the error signal added by the load L is cancelled and the power output from the load L is automatically corrected to match the initial incoming power signal. This process is looped and automatically compensates for any variations of either the incoming power signal 52 or the load L.

In both embodiments of the present invention previously presented, a negative error signal is subtracted from an initial signal. It should be understood that in certain variations of the invention, the first subtraction circuit can be replaced with an addition circuit, wherein a positive error signal can be added to the initial signal. This causes the same effects as does the subtraction circuit described.

It will be understood that the embodiments of the present invention that are illustrated and described are merely exemplary and that a person skilled in the art can make many variations to those embodiments. All such embodiments are intended to be included within the scope of the present invention as defined by the claims.

What is claimed is:

1. In a system that produces an initial signal and has at least one electronic component that adds a distortion error to said initial signal to create a distorted signal, a method of conditioning said initial signal to compensate for said distortion error, said method comprising the steps of:

subtracting said distorted signal from said initial signal to obtain an initial negative distortion error;

subtracting said initial negative distortion error from said initial signal to create an initial conditioned signal;

subtracting said distorted signal from said initial conditioned signal to obtain a subsequent negative distortion error;

providing a first subtraction circuit that receives both said initial signal and said initial negative distortion error, wherein said first subtraction circuit is comprised of an operational amplifier and resistors;

subtracting said subsequent negative distortion error from said initial conditioned signal with said first subtraction circuit to create a subsequent conditioned signal; and supplying said subsequent conditioned signal to said at least one electronic component in place of said initial signal.

2. The method according to claim 1, wherein said step of subtracting said distorted signal from said initial signal to obtain an initial negative distortion error includes providing a second subtraction circuit that receives both said initial signal and said distorted signal.

3. The method according to claim 1, wherein said initial signal has a frequency of between 0 kHz and 20 kHz.

4. The method according to claim 2, wherein said second subtraction circuit is comprised of an operational amplifier and resistors.

5. In a circuit having an incoming signal and downstream components that produce distortion signals as part of a distortion output, a method of conditioning said incoming signal to compensate for said distortion signals, comprising the steps of:

providing a first subtraction circuit that receives said incoming signal and said distorted output and subtracts said distorted output from said incoming signal to isolate said distortion signals wherein said first subtraction circuit is comprised of only an operational amplifier and resistors;

subtracting said distortion signals from said incoming signal to create a conditioned signal; and sending said conditioned signal to said downstream components in place of said incoming signal.

6. The method according to claim 5, wherein said step of subtracting said distortion signals from said incoming signal to create a conditioned signal includes providing a second subtraction circuit that receives said distortion signals and said incoming signal and subtracts said distortion signals from said incoming signal.

7. The method according to claim 5, further including the steps of:

subtracting said distorted output from said conditioned signal to obtain a subsequent negative distortion error;

subtracting said subsequent negative distortion error from said conditioned signal to create a subsequent conditioned signal; and supplying said subsequent conditioned signal to said downstream components in place of said conditioned signal.

8. The method according to claim 5, wherein said incoming signal has a frequency of between 0 kHz and 20 kHz.

9. The method according to claim 7, wherein said second subtractor is comprised of only an operational amplifier and resistors.

10. In a system that produces an initial signal and has at least one electronic component that produces a distorted output signal, a looped correction circuit comprising:

a first subtraction circuit that receives both said initial signal and said distorted output signal, wherein said first subtraction circuit subtracts said distorted output signal from said initial signal to create a negative error signal, and wherein said first subtraction circuit is comprised only of an integrated operational amplifier and resistors;

a second subtraction circuit that receives both said initial signal and said negative error signal, wherein said second subtraction circuit subtracts said negative error signal from said initial signal to produce a conditioned signal and substitutes said conditioned signal for said initial signal in said first subtraction circuit.

11. The circuit according to claim 10, wherein said second subtraction circuit is comprised only of an integrated operational amplifier and resistors.

* * * * *